(12) United States Patent
Kim (10) Patent No.: US 6,214,645 B1
(45) Date of Patent: Apr. 10, 2001

(54) METHOD OF MOLDING BALL GRID ARRAY SEMICONDUCTOR PACKAGES

(75) Inventor: Sung Jin Kim, Seoul (KR)

(73) Assignees: ANAM Semiconductor, Inc., Seoul (KR); Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/240,423

(22) Filed: Jan. 29, 1999

(30) Foreign Application Priority Data

| May 27, 1998 | (KR) | ............................................. | 98-19303 |
| May 27, 1998 | (KR) | ............................................. | 98-19304 |
| Sep. 8, 1998 | (KR) | ............................................. | 98-36897 |
| Sep. 8, 1998 | (KR) | ............................................. | 98-36898 |

(51) Int. Cl.$^7$ ..................................................... H01L 21/44
(52) U.S. Cl. ........................................... 438/110; 438/113
(58) Field of Search ..................................... 257/698, 738; 438/110, 113, 127, 11, 123, 126

(56) References Cited

U.S. PATENT DOCUMENTS

| 5,635,671 | 6/1997 | Freyman et al. | ..................... 174/52.2 |
| 5,859,475 | * 1/1999 | Freyman et al. | ..................... 257/738 |
| 5,866,942 | * 2/1999 | Suzuki et al. | ......................... 257/698 |

\* cited by examiner

Primary Examiner—David Nelms
Assistant Examiner—David Vu (57) ABSTRACT

A method of molding BGA semiconductor packages comprises grounding a PCB in the package to a grounded mold during the process of molding the package, thus preventing an accumulation of electrostatic charge on the components of the BGA package, thereby preventing any damage to the semiconductor chips, bonding wires or conductive traces in the package resulting from a sudden discharge of such an accumulated charge. The means for grounding the PCB may include grounding projections on one of the molds, and/or may comprise grounding pads, grounding bosses, or grounding tooling holes in the PCB. The grounding projections on the mold are positioned on opposite sides of a runner in the mold. The grounding pads or bosses are electrically connected to a ground via hole and a ground trace, and, in one embodiment are positioned on the bottom surface of the PCB outside of a package separation line. The grounding tooling hole is internally plated with a conductive metal layer to receive and make an electrical contact with a conductive tooling pin extending from one of the molds.

14 Claims, 9 Drawing Sheets

METHOD OF MOLDING BALL GRID ARRAY SEMICONDUCTOR PACKAGES

BACKGROUND OF THE INVENTION

1. Field of the Invention

The present invention relates, in general, to semiconductor packaging, and more particularly, to a method of molding a ball grid array semiconductor package that prevents the accumulation of an electrostatic charge in the package during molding, thereby preventing damage to the components in the package caused by an electrostatic discharge.

2. Description of the Related Art

The recent trend in consumer electronics has been toward smaller, lighter products having improved capabilities and capacities, which has, in turn, resulted in a demand for semiconductor chips that are smaller, more highly integrated, and of higher capacity. Accordingly, modern semiconductor packages must have excellent electrical characteristics, high heat dissipating capabilities, and a large input/output-terminal capacity, to enable such small, highly integrated, and efficient semiconductor chips to perform as expected.

Ball grid array (BGA) semiconductor packages have been proposed and widely used as an exemplary package capable of enabling small, efficient and highly integrated semiconductor chips to meet their design goals effectively. BGA packages are easily formed on a conventional printed circuit board (PCB) and can effectively reduce the overall length of electric circuits incorporating them. BGA packages also utilize power- and/or ground-bonding areas more effectively, thus yielding excellent electric characteristics. Also, the input/output terminal density of BGA packages is greater than that of conventional quad flat packages (QFPs), which better comports with the trend toward smaller, denser packages.

Figure 10A:
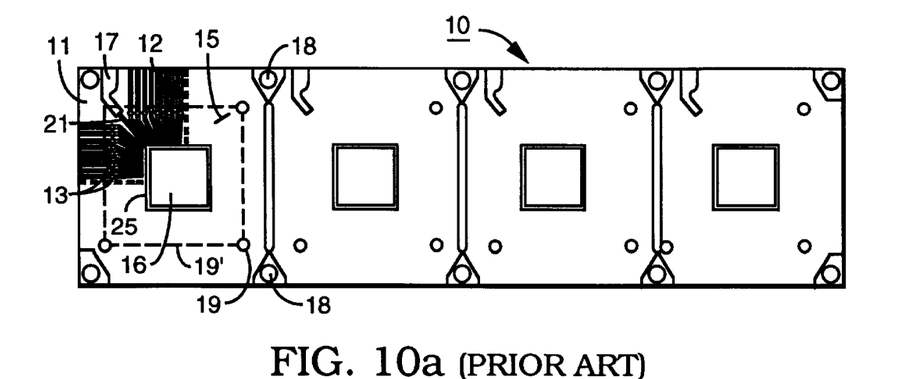
FIGS. 10a and 10b are top and bottom plan views, respectively, of a conventional PCB for BGA semiconductor packages.
Figure 10B:
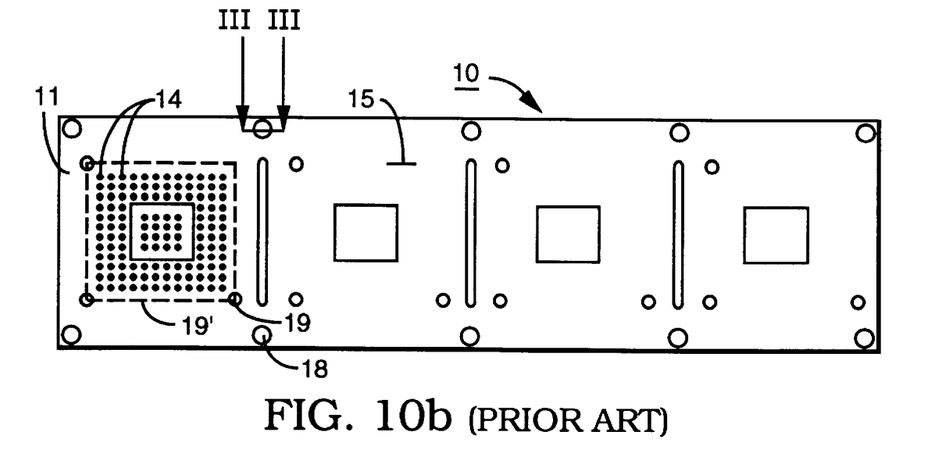
Figure 15:
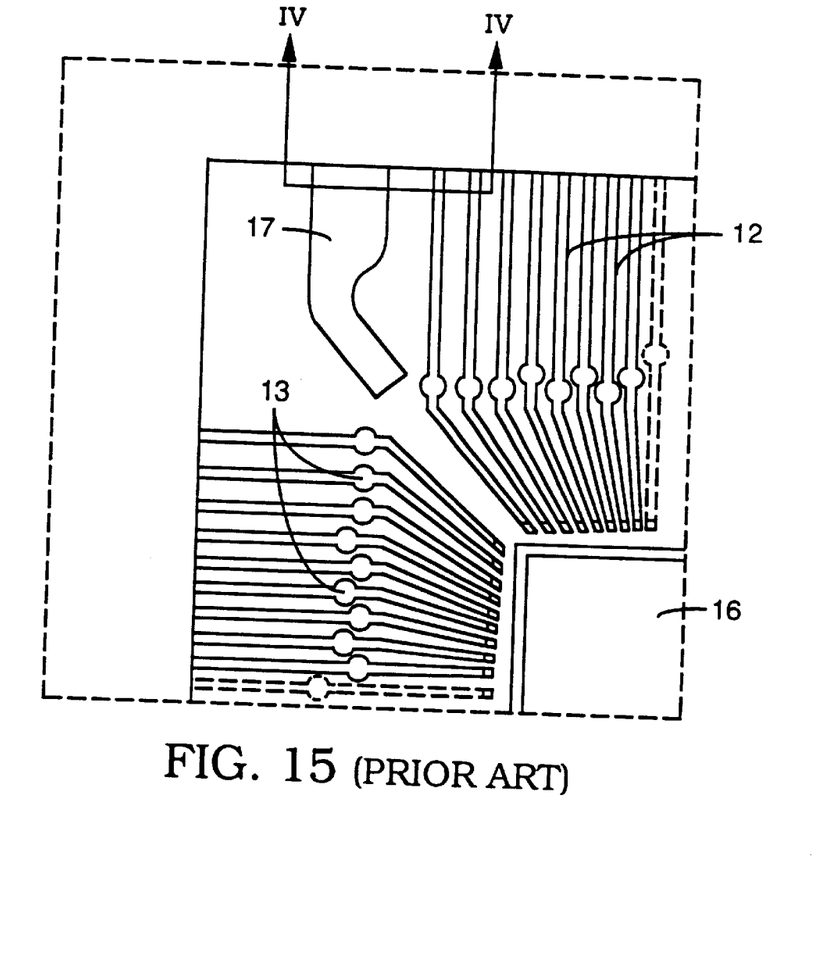
FIG. 15 is an enlarged partial plan view of an area including the mold runner gate of the typical PCB.

FIGS. 10a and 10b are top and bottom plan views, respectively, of a conventional, strip-type multiple-package PCB 10 typically used in the manufacture of BGA semiconductor packages. FIG. 15 is an enlarged plan view showing the area around a mold runner gate located in the upper left hand corner of each individual PCB of the multiple PCB 10 of FIG. 10a. The following description of the construction of the conventional PCB is with reference to FIGS. 10a, 10b and 15.

As shown in the drawings, the typical PCB 10 comprises a dielectric substrate 11 made of a thermosetting resin, e.g., a bismaleimidetriazine or polyimide resin. A plurality of conductive traces 12 are formed on each side of the substrate to form a predetermined circuit pattern on each side thereof. A plurality of die, or chip, mounting plates 16 are centrally provided on the top surface of the substrate 11 for the mounting of semiconductor chips thereon. A plurality of conductive via holes 13 are formed through the substrate 11 to electrically connect the conductive traces 12 of both sides of the PCB to each other. A plurality of solder ball lands 14 are electrically connected to the conductive traces 12 on the bottom surface of the substrate 11.

A non-conductive solder mask 15 coats both sides of the substrate 11, except for selected areas of the conductive traces 12, e.g., around the edge of the chip mounting plate 16, and on the solder ball lands 14, and serves to electrically isolate the traces 12 from each other and to protect them from harmful environmental elements.

As shown in FIGS. 10a and 15, a mold runner gate 17, comprising a thin, conductive metal plate or plating of, e.g., gold or palladium, extends from a corner of the substrate 11 to the chip mounting plate 16, and serves to guide melted molding compound, e.g., a resin, into the region of the chip mounting plate 16 during a package molding operation described in more detail below. The bonding strength between the material of the mold gate runner 17 and the molding resin is much lower than that between the resin and the solder mask 15, which enables the resin to be easily de-gated from the gate 17 without damaging the conductive traces 12 after molding is complete.

The mold runner gate 17 is electrically connected to a ground ring 25 formed along the edge of the chip mounting plate 16 through a conductive ground trace 21. The grounded elements of a semiconductor chip (not shown in FIG. 10a) are electrically connected to the ground ring 25 by means of bonding wires (not shown) that extend between the chip and the ground ring. In the BGA package, ground signals applied from the semiconductor chip to the mold runner gate 17 enable precise measurement of voltage drops occurring between the chip and ground. Likewise, any voltage drops occurring in the wire bonds between the chip and the conductive traces 12 can also be checked easily and precisely. The grounded mold runner gate/ground ring arrangement therefore forms an effective common ground area for purposes of complete circuit definition within the BGA package.

As seen in FIGS. 10a and 10b, tooling holes 18 are used in the strip-shaped PCB 10 to position and fix the PCB in a molding tool assembly. Singularizing holes 19 are used as reference points during singularization, or separation, of the individual BGA packages from the multiple-package PCB, which is typically accomplished by die cutting. The dotted square 19' defined by the singularizing holes 19 corresponds to the line along which the substrate is cut when the individual BGA packages are separated from the plurality of packages simultaneously fabricated on the PCB 10.

Figure 16:
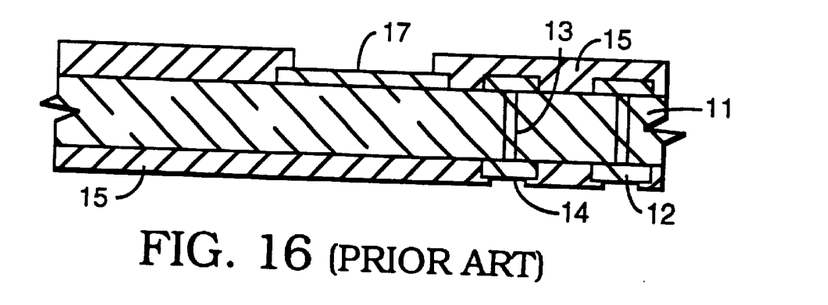
FIG. 16 is a sectional view of the typical PCB taken along the line IV—IV in FIG. 15.

FIG. 16 is a sectional view of the PCB 10 taken along the line IV—IV in FIG. 15. As may be seen in FIG. 16, the solder mask 15 is thicker than the mold runner gate 17, and has an opening through it to expose a portion of the upper surface of the mold runner gate. The solder mask 15 is also locally relieved to expose areas on the solder ball lands 14 formed on the conductive traces 12 on the bottom surface of the PCB 10 so that solder balls (not shown) can be attached thereto.

Figure 11:
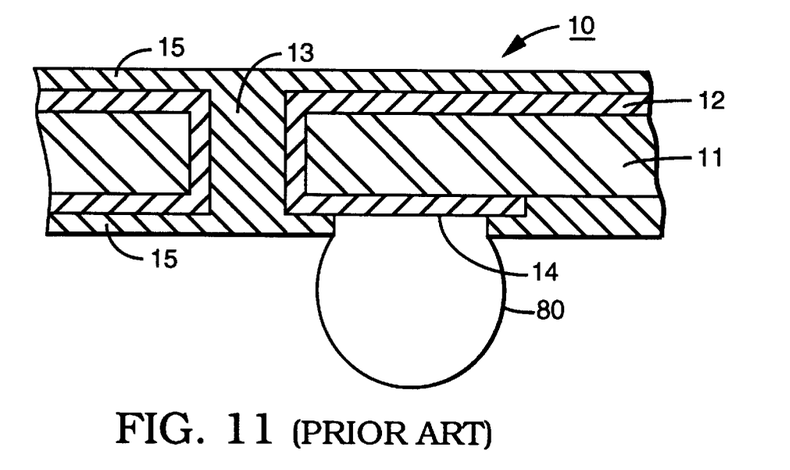
FIG. 11 is a sectional view of a via hole formed on the PCB of FIG. 10b.

FIG. 11 is a sectional view through the region around a via hole 13 of the PCB 10. As shown in the drawing, the via holes 13 are formed on respective conductive traces 12. The interior wall of the via hole 13 is plated with a conductive metal, while the solder mask 15 overlays the top surface of the trace 12 and fills the void in the via hole 13. A solder ball 80 is welded to the solder ball land 14 and is used as an input/output terminal of the package.

Figure 12:
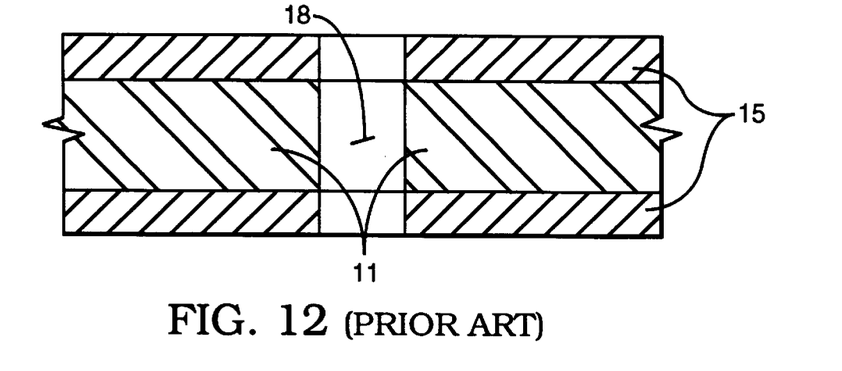
FIG. 12 is a sectional view of the PCB taken along the line III—III in FIG. 10b.

FIG. 12 is a sectional view through a tooling hole 18, as taken along the line III—III in FIG. 10b. FIG. 12 reveals that the tooling hole 18 is, like the via hole 13, formed through the thickness of the substrate 11 of the PCB. However, unlike the via hole 13, the tooling hole 18 does not include a conductive layer on its interior surface that electrically connects the upper and lower surfaces of the board, nor does the solder mask 15 fill the interior void of the hole.

Figure 18:
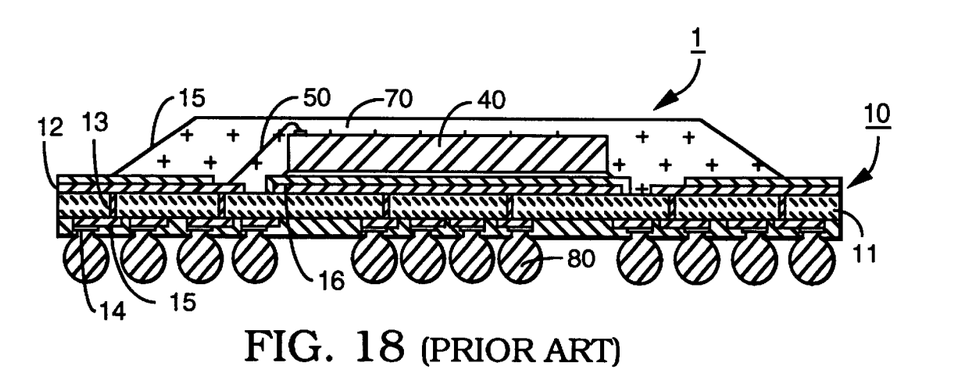

A conventional BGA semiconductor package 1 that incorporates a conventional PCB 10 of the type described above is shown in elevational cross-section in FIG. 18. Typically, a plurality of such packages are simultaneously fabricated on the PCB 10 in the following manner. First, a plurality of semiconductor chips 40 are mounted, typically by means of a bonding layer (not shown), on the strip-shaped PCB 10, one on each of the chip mounting plates 16. Each chip 40 is then electrically connected to areas on the conductive traces 12 which are free of the solder mask 15 using a plurality of fine bonding wires 50.

After wire bonding is complete, a plurality of resin envelopes 70 are molded onto the upper surface of the PCB 10 around each of the chips 40 and its associated bonding wires 50 to encapsulate and protect them against damaging mechanical and electrical environmental elements. After molding, a plurality of solder balls 80, which are used as the input and output terminals of the packages 1, are respectively welded to the solder ball lands 14. The solder ball welding step is followed by a singularizing step in which the simultaneously formed plurality of BGA packages 1 are each separated from the PCB 10, typically by die cutting, into individual BGA packages 1 of the type illustrated in FIG. 18.

Figure 13A:
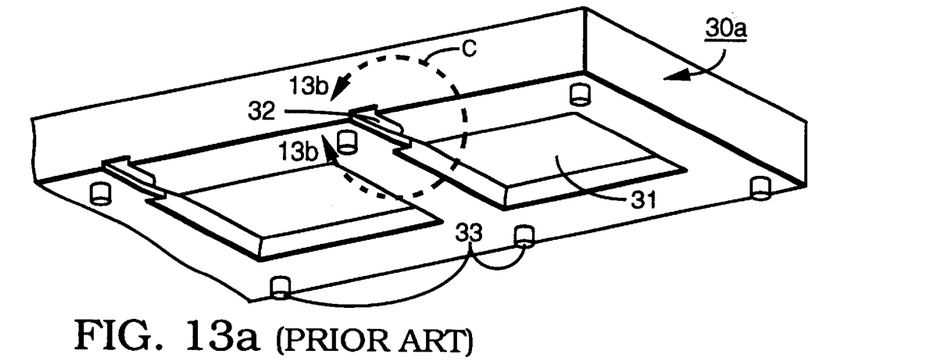
FIG. 13a is a partially broken-away bottom perspective view of a typical top mold used in the process of molding BGA packages.
Figure 13B:
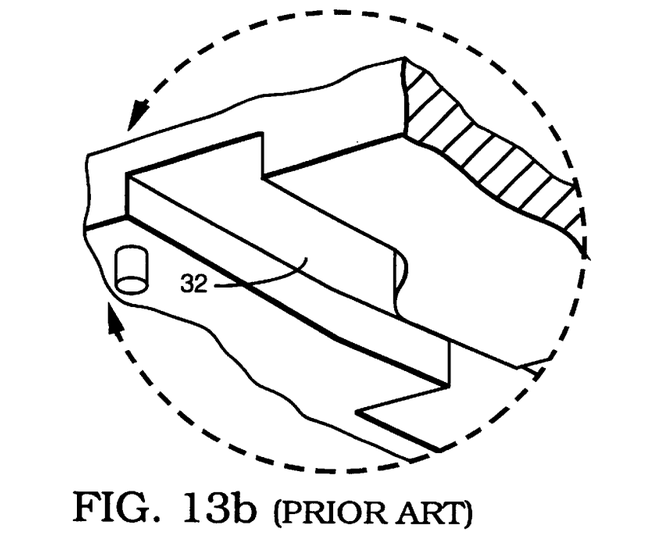
Figure 14:
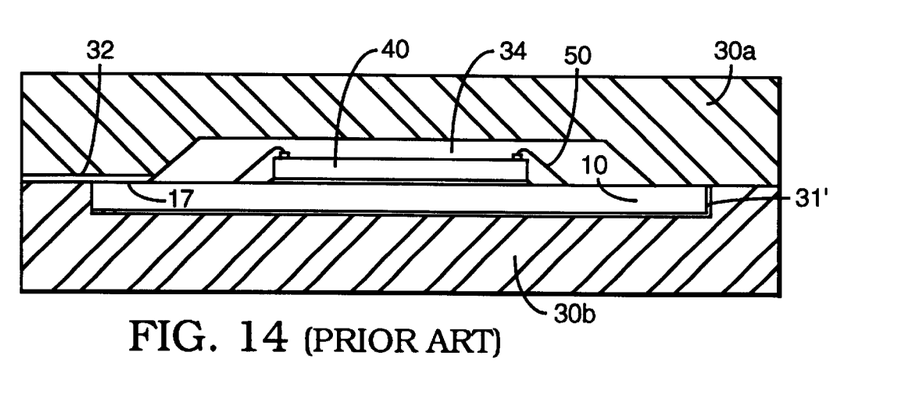
FIG. 14 is a sectional view through a typical BGA package PCB being compressed and held between top and bottom molds during package molding.

In the above manufacturing process, the molding step is carried out with the individual semiconductor chips 40 mounted on the PCB 10 and positioned between top and bottom molds 30a and 30b, as shown in FIG. 14. The encapsulating resin reinforces the delicate wires 50 and bonds them securely to both the associated chip 40 and the conductive traces 12. FIG. 13a is a partially broken-away bottom perspective view of a typical top mold 30a used in the molding step of FIG. 14. FIG. 13b is an enlarged view of the region labeled "C" in FIG. 13a.

As seen in FIG. 14, the bottom mold 30b has an upper depression 31' in its top surface, which serves to seat the PCB 10 therein, while the top mold 30a is provided with a plurality of lower depressions 31 (see FIG. 13a), each having a configuration corresponding to the top portion of the molded envelope 70 of each BGA package 1. A plurality of cavities 34 (FIG. 14) is thus defined between the lower depressions 31 of the top mold 30a and the top surface of the PCB 10, each of which encloses one of the semiconductor chips 40 and its associated bonding wires 50 positioned on the top surface of the PCB 10.

As seen in FIGS. 13a and 13b, a runner 32 is formed in the top mold 30a at a position near the corner of each cavity to guide injected molten molding resin (not shown) into the cavity 34. The runners 32 are formed at positions corresponding to the positions of the respective mold runner gates 17 (see FIGS. 10a, 17) on the PCB 10. The lower surface of the top mold 30a mates with the upper surface of the bottom mold 30b on opposite sides of the runner 32 to define a conduit for the introduction of the resin into the cavity 34.

The molding resin is injected under pressure into the cavity 34 through the runner 32, thereby forming a resin envelope 70 on the upper surface of the PCB 10 which completely encapsulates the chip and its associated bonding wires 50. The top mold 30a is provided with a plurality of tooling pins 33 that extend through the tooling holes 18 of the PCB 10 and into corresponding apertures (not shown) in the bottom mold 30b, thus accurately locating and securely fixing the PCB 10 within the molds during the molding process. In this regard, it should be noted that the mounting of the tooling pins 33 is not limited to the upper mold 30a; thus, in an alternative configuration, the tooling pins can as easily be mounted on the bottom mold 30b to extend upwardly through the tooling holes 18 in the PCB 10.

Figure 17:
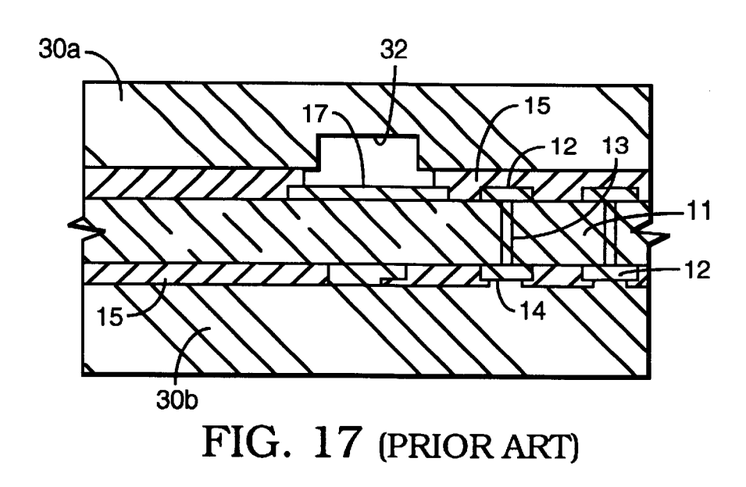
FIG. 17 is an enlarged partial sectional view through the typical PCB of FIG. 16 being compressed and held by top and bottom molds during the molding process; and, FIG. 18 is a sectional view through a typical BGA semiconductor package.

FIG. 17 is an enlarged, partial sectional view showing the PCB 10 of FIG. 16 compressed between the top and bottom molds during the typical package molding process.

Importantly, it may be seen from FIG. 17 that both the mold runner gate 17 and the solder ball lands 14 on the PCB 10 are separated from the top and bottom molds 30a, 30b, respectively, by the thickness of the dielectric solder mask 15, i.e., that they are electrically isolated from both the top and bottom molds 30a, 30b, respectively, during the molding process.

During molding, hot molten molding resin under high pressure is injected into the cavity 34 through the conduit formed between the runner 32 in the top mold 30a and the mold runner gate 17 on the PCB 10, causing the molten resin to flow over the chip 40, the conductive bonding wires 50, and the surface of the PCB 10 with frictional contact. This frictional flow of the molten resin over these components generates static electricity, which is induced on the chip 40, the wires 50 and the traces 12 of the PCB 10, thereby causing an undesirable accumulation of a strong electrostatic charge on these elements.

In those cases where the supply voltage specified for the semiconductor chips, or the allowable variation therein, is relatively high, a rapid electrostatic discharge of the above charge accumulation to ground will not necessarily result in any damage to the components of the BGA package. However, when the level of supply voltage specified for the semiconductor chips or allowable variation therein is relatively low, then a rapid discharge of the accumulated charge can cause permanent damage to the semiconductor chip 40, the bonding wires 50 and/or the conductive traces 12 of the BGA packages.

This undesirable discharge can occur when the packages are removed from the molds after the molding process, or when they are brought into contact with other processing equipment during manufacture. When this discharge occurs, components in the semiconductor chip, the bonding wires, and/or the fine circuit patterns of the PCB itself may be irreparably burnt open. Therefore, the accumulation of an electrostatic charge on the components of a BGA package during molding presents a potentially serious problem that must be overcome if BGA packages are to remain a viable semiconductor packaging candidate, especially in view of the recent trend toward chips that are smaller, higher capacity, and more highly integrated.

SUMMARY OF THE INVENTION

The present invention provides a method of molding ball grid array semiconductor packages which almost completely prevents any accumulation of electrostatic charge in the package during package molding, thereby effectively preventing any damage to the semiconductor chips, bonding wires or conductive traces due to a sudden electrostatic discharge. To this end, the method of the present invention includes means for grounding the PCB of the package to at least one of the two encapsulation molds, which is itself connected to ground through the molding equipment, thereby preventing the accumulation of any electrostatic charge on the package during the molding operation.

A first embodiment of this invention comprises forming a grounding projection adjacent to the runner of the mold and contacting the mold runner gate of the PCB with the projection to ground the PCB during package molding.

A second embodiment of the method comprises forming a flat grounding pad on the PCB, the pad having a height equal to or greater than the thickness of the solder mask, and electrically connecting the pad to a ground via hole and/or a ground trace on the PCB. The grounding pad is disposed and configured to make a positive contact with at least one of the molds when the PCB is compressed between the molds, and the molding process is carried out while the grounding pad is in electrical contact with at least one of the molds.

A third embodiment of the method comprises forming a raised grounding boss on the PCB, the boss having a height equal to or greater than that of the solder mask, and electrically connecting the boss to a ground via hole and/or a ground trace on the PCB. In this embodiment, the grounding boss makes a positive electrical contact with at least one of the molds during the molding process.

In accordance with a fourth embodiment of the invention, a grounding tooling hole plated internally with a conductive metal layer is formed in the PCB and electrically connected to a ground via hole and/or a ground trace on the PCB. In the fourth embodiment, the grounding tooling hole makes a postive electrical contact with a conductive metal tooling pin protruding from at least one of the molds during the molding process.

BRIEF DESCRIPTION OF THE DRAWINGS

The above and other features and advantages of the present invention will be more clearly understood from a consideration of the following detailed description of its preferred embodiments, particularly if taken in conjunction with the accompanying drawings, in which:

FIG. 1b is an enlarged view of the circled region "A" in FIG. 1a;

FIG. 6b is an enlarged view of the circled region "B" in FIG. 6a;

FIG. 13b is an enlarged view of the circled region "C" in FIG. 13a;

DETAILED DESCRIPTION OF THE PREFERRED EMBODIMENTS

This application is substantially similar to Korean Patent Application Nos.: 98-19303 (filed May 27, 1998); 98-19304 (filed May 27, 1998); 98-36897 (filed Sep. 8, 1998); and, 98-36898 (filed Sep. 8, 1998), the disclosures of which are incorporated herein in their entireties by this reference.

Figure 1A:
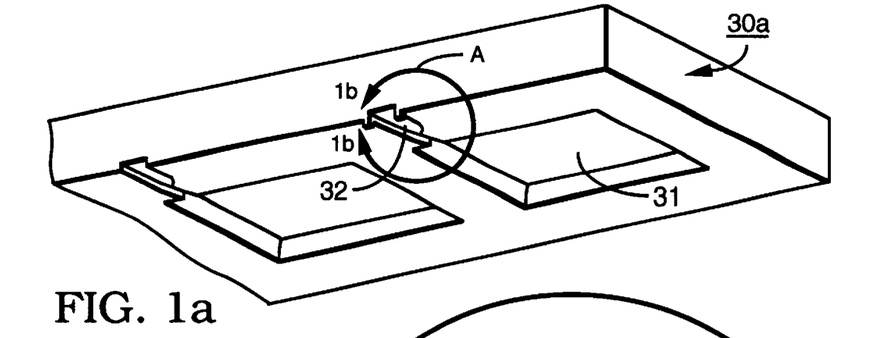
FIG. 1a is a partially broken-away bottom perspective view of a top mold used in the first preferred embodiment of the method of present invention.
Figure 1B:
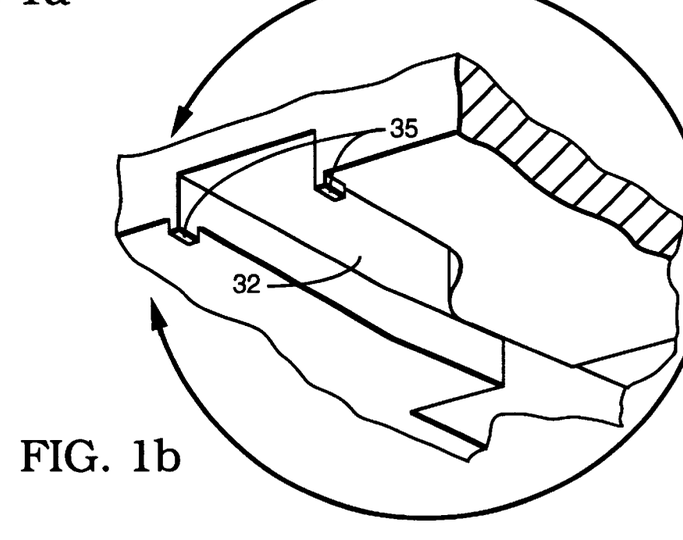

FIG. 1a is a partially broken-away bottom perspective view of a top mold 30a used in the first embodiment of the method of the present invention. FIG. 1b is an enlarged view of the region "A" seen in FIG. 1a. In the embodiment of FIGS. 1a and 1b, the shape of the mold 30a of this invention is generally the same as that described above in connection with the conventional mold of FIGS. 13a and 13b, except that the mold 30a of the present invention has two grounding projections 35 on its lower surface that straddle the runner 32.

Figure 2:
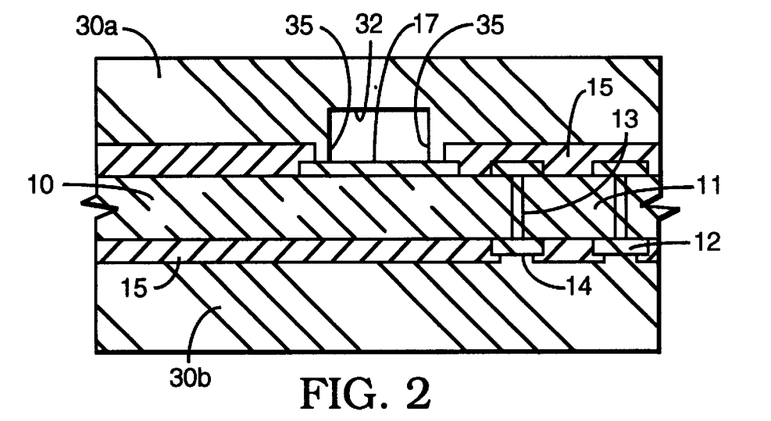
FIG. 2 is a partially enlarged sectional view showing an area around the mold runner gate of the PCB being compressed and held between the top mold of FIGS. 1a and 1b and a bottom mold.

FIG. 2 is an enlarged partial sectional view showing the region around the mold runner gate 17 of a conventional BGA package PCB 10 being compressed and held between the top and bottom molds 30a and 30b according to the first embodiment of this invention. As shown in FIG. 2, when the PCB 10 is held in compression between the top and bottom molds 30a and 30b during molding, the lower ends of the two grounding projections 35 simultaneously and positively contact the top surface of the mold runner gate 17 of the PCB 10. The mold runner gate 17, which is itself connected to ground features on the PCB 10, e.g., the chip ground ring 25 (see FIG. 10a), is thereby grounded to the grounded top mold 30a. As a result, any electrostatic charge generated by the injection of hot, molten resin into the cavity between the two molds 30a and 30b through the runner 32 is immediately bled off to the top mold 30a through the mold runner gate 17, and thence to ground through the molding apparatus. This effectively prevents the buildup of any electrostatic charge on the components of the BGA package, and hence, any damage to them that could result from a sudden discharge of such a charge buildup. A better appreciation of the charge-bleed-off function of the two grounding projections 35 may be obtained by a comparison of the embodiment of FIG. 2, showing the mold runner gate 17 positively grounded to the upper mold 30a by means of the two grounding projections 35, and the electrically isolated prior art configuration shown in FIG. 17.

In this first embodiment of the invention, it is desirable that the grounding projections 35 on the top mold 30a both contact the mold runner gate 17 of the PCB 10 positively and reliably, and also that they prevent any leakage of resin from the cavities in the molds 30a and 30b during molding. Therefore, it is important that the height of projections 35 be closely controlled to a reference height that is equal to or slightly greater than the thickness of the solder mask 15 above the PCB 10, less the height of the mold runner gate 17 above the board. That is, when the height of the projections 35 is less than the reference height, it is difficult to reliably contact the mold runner gate 17 with the projections 35 without forcibly biasing the top mold 30a down onto the PCB 10, which could result in damage to the circuit pattern on the PCB. On the other hand, if the height of the projections 35 is much greater than the reference height, molten resin could easily leak from the cavity of the top and bottom molds 30a and 30b during molding. Of course, the precise dimension of the projections 35 can be modified in accordance with the particular type of resin used, the thickness of the PCB 10, the particular material of the substrate 11, and the particular type of molds 30a and 30b used, provided only that the projections 35 accomplish the grounding function of the first embodiment of the invention, as described above.

It should also be noted that the particular number, location and configuration of the grounding projections 35 can be modified somewhat from that shown in the figures, again provided that the projections 35 effectively contact the mold runner gate 17 when the PCB 10 is compressed between the top and bottom molds 30a and 30b during molding. However, as shown in FIGS. 1a, 1b and 2, it is preferable that two projections 35 be formed on the lower surface of the top mold 30a, and preferably, on opposite sides of the runner 32, because this configuration effectively reduces the total local force applied by the projections 35 to the PCB 10 during molding. In this regard, it has also been found more preferable to form discontinuous projections 35, like individual fingers, alongside the runner 32, rather than long, continuous projections. Further, it is more preferable to form the projections 35 at or near the edge of the top mold 30a, rather than inboard thereof.

The grounded molding method of the first embodiment described above enables the benefits of this invention to be obtained using conventional BGA PCB's. However, the invention is not limited to the first embodiment. As described in more detail below in connection with the second, third and fourth embodiments thereof, the benefits of this invention can also be achieved using conventional top and bottom molds by appropriately grounding the PCB to at least one of the molds in the manner described below.

Figure 3:
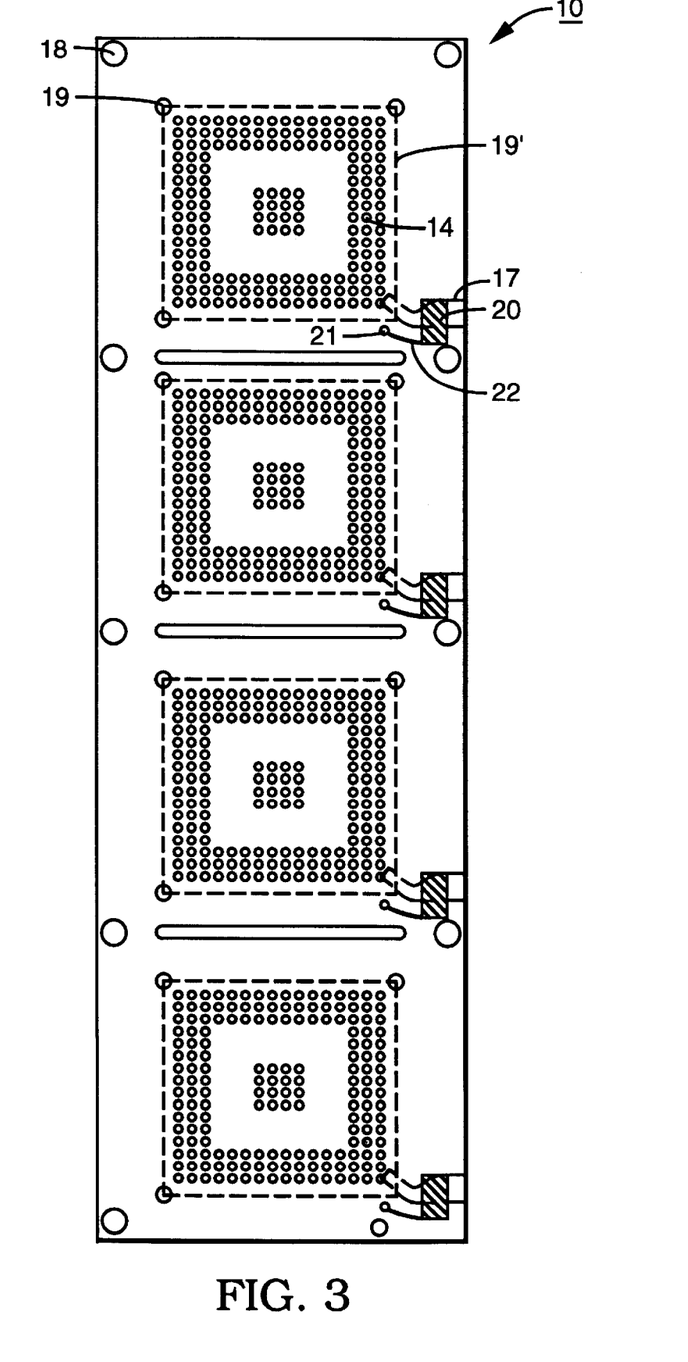
FIG. 3 is a bottom plan view of a PCB used in the second preferred embodiment of the method of the present invention.
Figure 4:
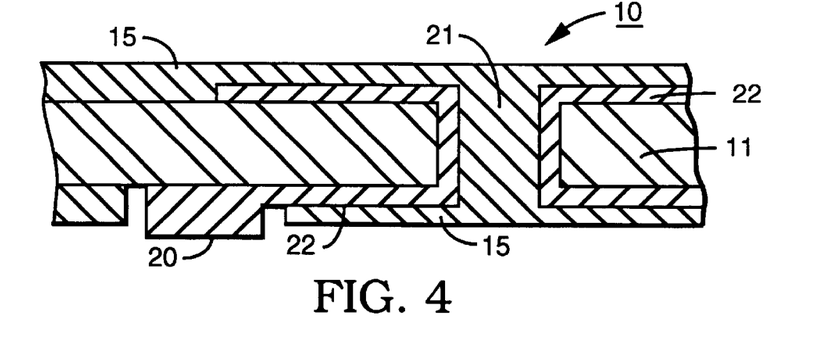
FIG. 4 is an enlarged, partial sectional view through a grounding pad of the PCB of FIG. 3.

FIG. 3 is a plan view of the bottom surface of a PCB 10 used in a second embodiment of the method of this invention, showing a rectangular, cross-hatched grounding pad 20, which is used as a means for grounding the PCB 10 during the molding process. An enlarged, partial sectional view through one of the grounding pads 20 is shown in FIG. 4. Except for the grounding pad 20, the features of the PCB 10 of the second embodiment are substantially similar to those of the typical PCB seen and described above in connection with FIGS. 10a, 10b, 11 and 15.

The PCB 10 of the second embodiment comprises a resin substrate 11 (see FIG. 4) having a plurality of conductive traces, including at least one ground trace 22, formed on opposite sides thereof. A plurality of chip mounting plates are centrally provided on the top surface of the substrate for mounting semiconductor chips thereon. A plurality of conductive via holes, including at least one ground via hole 21, are formed in the substrate 11 to electrically connect the circuit patterns of opposite sides of the substrate 11 to each other. A plurality of solder ball lands 14 are electrically connected to the conductive traces 12 on the bottom surface of the substrate to provide attachment points for a plurality of solder balls (not shown). A non-conductive solder mask 15 is formed over the circuit patterns on both sides of the substrate 11 except at selected areas of the conductive traces 12 around the edge of each chip mounting plate 16, and on the solder ball lands 14. A plurality of singularization holes 19 are formed at the corners of each chip mounting plate 16, and a plurality of tooling holes 18 are formed at its edges for locating and fixing the PCB in the molding tool.

In the second embodiment, the grounding pads 20 are formed on the bottom surface of the PCB 10 adjacent to each chip mounting plate 16 and, as more fully explained below, enable the PCB 10 to contact and be grounded to the bottom mold 30b during the molding process. The grounding pad 20 is electrically connected on the PCB to both the ground via hole 21 and the ground trace 22, and through this common grounding feature, serves to prevent the accumulation of any electrostatic charge on the components during molding of the package.

As shown in FIG. 3, the grounding pads 20 are formed at locations outside of the cutting lines 19', which result in their being cut away from the individual BGA packages when the latter are singularized from the PCB 10. However, it should be understood that the grounding pads 20 may alternatively be designed to remain on the individual BGA PCB's after singularization by forming them inside of the cutting lines 19', should that be desirable.

The enlarged sectional view of the grounding pad 20 in FIG. 4 shows that each of the grounding pads 20 is preferably raised slightly above the solder mask 15 surrounding the pads so that the pads 20 positively contact the bottom mold (not shown) and thereby reliably ground the PCB 10 to the mold during the molding operation. However, the grounding pads 20 may also be formed at the same height as the solder mask 15 without adversely affecting their function. This is because the resin solder mask 15 is more compressible than the metal grounding pads 20, and hence, when the PCB 10 is forcefully clamped between the top and bottom molds during molding, the bottom mold makes a reliable electrical contact with the grounding pads 20. Importantly, as may be seen in FIG. 4, each of the grounding pads 20 is electrically connected from the bottom surface to the top surface of the PCB 10 by means of both the ground via hole 21 and the ground trace 22, thus ensuring a complete grounding of both surfaces of the PCB 10.

Figure 5A:
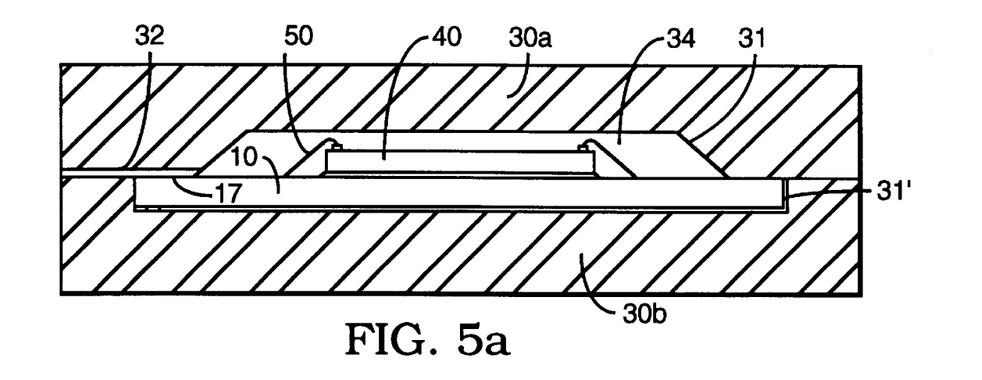
FIG. 5a is a sectional view through the PCB of FIG. 3 being compressed and held between top and bottom molds during a molding process.
Figure 5B:
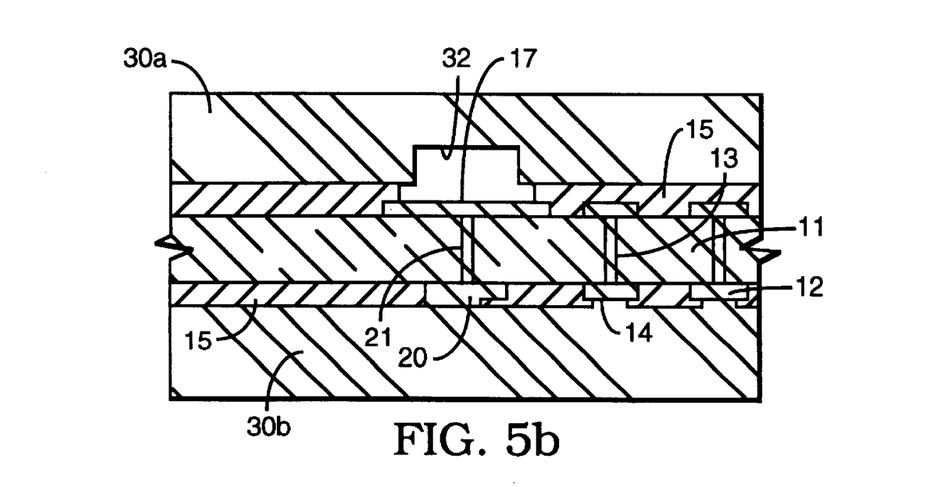
FIG. 5b is an enlarged partial sectional view showing an area around the mold runner gate of a PCB being compressed and held between top and bottom molds during package molding.

FIG. 5a shows the PCB 10 of FIG. 3 being compressed and held between the top and bottom molds 30a and 30b during package molding. An enlarged, partial sectional view of the region around the mold runner gate 17 and the grounding pad 20 of the above embodiment is shown in FIG. 5b. As shown in these figures, the PCB 10 of the second embodiment is easily yet reliably grounded to the bottom mold 30b by the grounding pad 20 by simply positioning the PCB 10 in the upper depression 31 of the bottom mold 30b and compressing it with the upper mold 30a during the molding process.

In FIGS. 5a and 5b, the grounding pads 20 are shown formed on the bottom surface of the PCB 10. However, it is altogether possible, when desirable, to form the grounding pads 20 on either an edge of the PCB 10, and/or at appropriate locations on the top surface of the PCB 10 (i.e., outside of the encapsulated areas), without adversely affecting the function of this second embodiment of the invention.

Figure 6A:
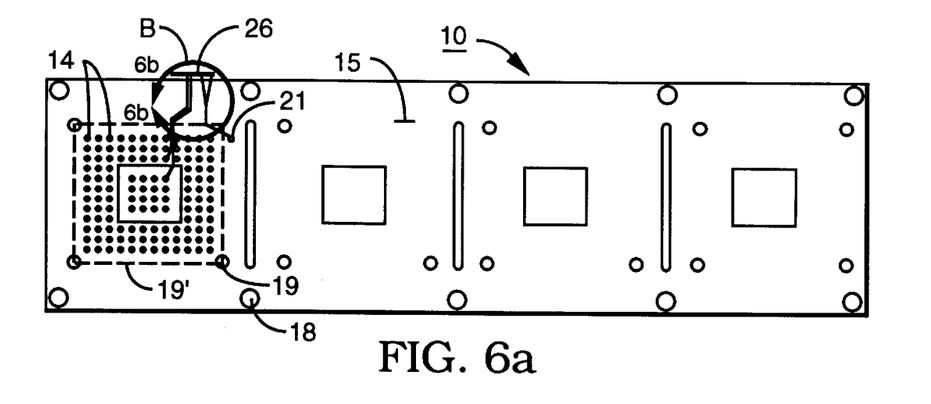
FIG. 6a is a bottom plan view of a PCB used in the third preferred embodiment of the method of the present invention.
Figure 6B:
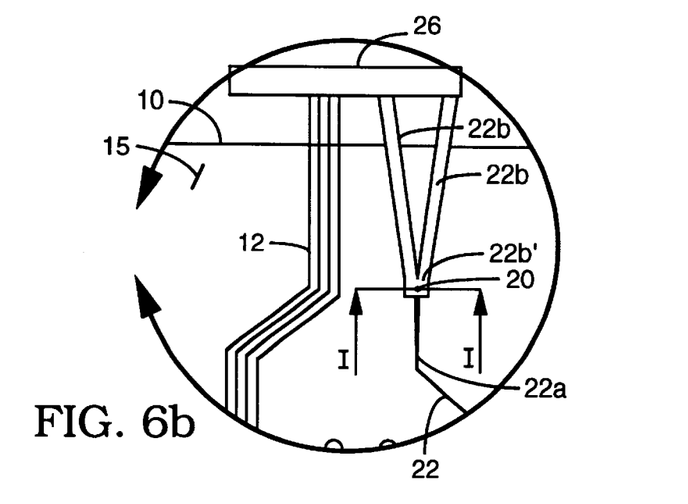
Figure 7:
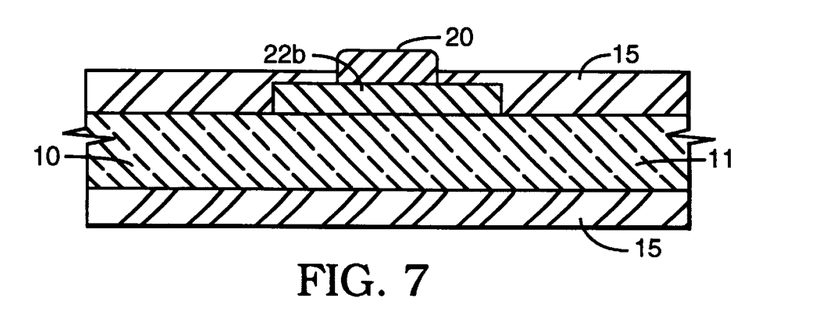
FIG. 7 is a sectional view of the PCB taken along the line I—I in FIG. 6b.

FIG. 6a is a bottom plan view of a PCB 10 used in a third preferred embodiment of the method of the present invention. An enlargement of the circled region "B" of FIG. 6a is shown in FIG. 6b. FIG. 7 is a sectional view taken along the line I—I in FIG. 6b. In the third embodiment shown in these figures, the configuration of the PCB 10 remains generally the same as that described in connection with the second embodiment illustrated in FIG. 3. Accordingly, the following description focuses on the differences between the two embodiments.

In FIG. 6a, a plating current bus 26 is shown schematically as a dark line, or bar. A current bus 26 such as the one illustrated is typically positioned between adjacent patterns of simultaneously fabricated square or rectangular raw PCB's which are eventually cut into a plurality of strip-type PCB's 10 after fabrication is complete. During fabrication, a variety of conductive metals, such as copper, tin, and/or gold, are typically plated onto the PCB's using the current bus 26 as a means for applying the plating current. It will be understood that the current bus 26, along with the portion of the underlying main board substrate, is separated from the individual strip-type PCB's 10 and discarded after they have been severed from the main board. However, in FIGS. 6a and 6b, the plating current bus 26 is shown as if it were still attached to the PCB 10 for purposes of description of the third embodiment of this invention.

Importantly, it should be noted that in the third embodiment, the conductive traces 12, the ground traces 22, 22a and 22b, the conductive via holes 14, and the ground via holes 21 are all commonly connected to the plating current bus line 26, for reasons that are explained in more detail below.

As shown in FIG. 7, the means for grounding the PCB 10 during molding according to the third embodiment comprise a grounding boss 20. The grounding boss 20 is formed by plating a raised layer of a conductive metal, such as gold, on the junction of the specially designed ground trace 22b formed on the top surface of the PCB 10. The grounding boss 20 preferably has a height not less than the thickness of the resin solder mask 15 and, to enable the grounding boss 20 to reliably contact at least one of the molds during package molding, the grounding boss 20 is preferably formed to be slightly higher than the solder mask 15. The grounding bosses 20 are also preferably formed at positions adjacent to the mold runner gates (not shown), as this makes it easier to electrically connect the bosses to the mold runner gates on the PCB, and enables the design of the PCB 10 to closely approximate that of a conventional PCB.

As in the case of the grounding pads 20 of the second embodiment, the height of the grounding bosses 20 of the third embodiment is not critical, provided only that they positively and reliably contact at least one of the top and bottom molds 30a and 30b when the PCB 10 is compressed between the molds during molding, and also provided that they do so without damaging the PCB 10.

Also, as with the second embodiment, the individual BGA packages can be separated from the strip-type PCB 10 free of any grounding bosses 20 by forming the bosses at positions outside of the cutting lines 19'. However, the grounding bosses 20 can also be designed to remain in the singularized BGA packages by forming them at a position inside each of the package cutting lines 19', if desired. Briefly, the position of the grounding bosses 20 may be varied within reason without adversely affecting their function, provided that they effectively ground the PCB 10 to at least one of the molds during package molding, and thereby prevent an accumulation of any electrostatic charge on the semiconductor chips, the bonding wires, and/or the conductive traces of the PCB 10 during molding.

The fabrication of an exemplary PCB 10 having the grounding bosses 20 of the third embodiment is now discussed with reference to FIG. 6b. The ground traces 22, 22a and 22b extend from the ground via hole 21 before connecting to the current bus 26 (FIG. 6a). The two ground traces 22b, which are connected directly to the current bus 26, are arranged in a V-shaped configuration that converge at a junction 22b' (FIG. 6b). The junction 22b' is connected to one end of the ground trace 22a, while the other end of the ground trace 22a connects to an end of the ground trace 22. The ground trace 22 is connected at its other end to the ground via hole 21.

The ground via hole 21 may be electrically connected to a mold gate runner 17 (not seen in FIGS. 6a, 6b) formed on the top surface of the PCB 10 in the same manner as described for the embodiment shown in FIG. 3. The mold gate runner 17 is, as previously described, electrically connected to the ground ring 25 (see FIG. 10a) on the PCB, which, as previously described, is electrically connected to the ground pad of a semiconductor chip by means of a plurality of bonding wires. The connection between the mold gate runner 17 and the ground ring 25 is implemented in the same manner as that of the conventional PCB described above.

The ground traces 22, 22a and 22b of the PCB 10 are coated with the solder mask 15 in the same manner as that described for the conventional PCB. However, it is important to note that the solder mask 15 is not formed over the junction 22b' of the V-shaped ground traces 22b, so that the junctions remain free of any solder masking 15. The grounding bosses 20 are formed on the PCB 10 in the openings in the solder mask 15 at the junctions 22'.

Each of the V-shaped ground traces 22b is configured to be narrower and/or thinner than the current bus 26, while the middle ground trace 22a, connected to the junction 22b' of the ground traces 22b, is configured to be narrower and/or thinner than each of the ground traces 22b. This configuration causes a plating current of a very high density to flow through the middle ground trace 22a during the plating process, which quickly and reliably plates, in a single plating operation, a raised metal grounding boss 20 onto the junction 22b' that is higher than the solder mask 15 (FIG. 7).

In the second and third embodiments described above, the grounding parts 20 are illustrated as being circular or cylindrical in configuration. However, those skilled in the art should recognize that the grounding pads or bosses 20 are not limited to these particular configurations, but rather, may be designed to have another configuration where desirable. Further, the position, area and height of these grounding parts 20 may be varied within reason without adversely affecting their function, provided only that they positively and reliably ground the PCB 10 to at least one of the molds during the molding operation.

Figure 8:
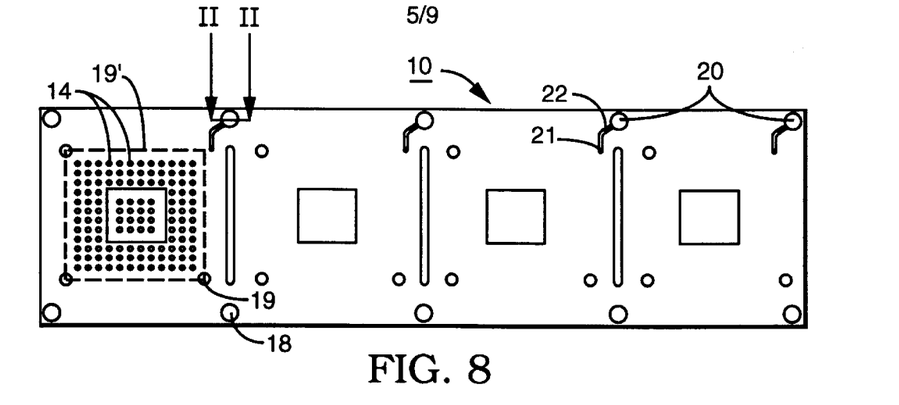
FIG. 8 is a bottom plan view of a PCB used in the fourth embodiment of the method of the present invention.
Figure 9:
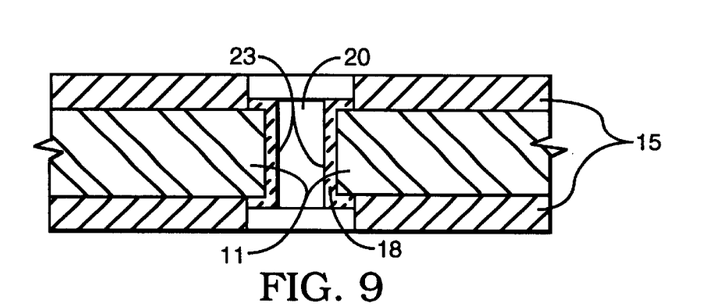
FIG. 9 is a sectional view of the PCB taken along the line II—II in FIG. 8.

FIG. 8 is a bottom plan view of a PCB 10 in accordance with a fourth embodiment of this invention. FIG. 9 is a sectional view of the PCB 10 taken along the line II—II in FIG. 8. In this fourth embodiment, the interior walls of the tooling holes 18 are plated with a conductive metal to provide a means 20 for grounding the PCB 10 during package molding. The overall configuration of the PCB 10 in the fourth embodiment shown in FIGS. 8 and 9 is generally the same as that in the first three embodiments described above, except for the differences described below.

As shown in FIG. 8, the position and construction of the ground via holes 21 also remains generally the same as that described for the other embodiments of this invention. The ground via holes 21 may be connected to the mold runner gate (not seen in FIG. 8), and the solder masks 15 (see FIG. 9) are formed on the PCB in the same manner as that described for the other embodiments of this invention. One end of each ground trace 22 is electrically connected to an associated ground via hole 21, while the other end of the trace 22 is electrically connected to an associated tooling hole 18 which is used as the grounding means 20 of the PCB 10.

Referring to FIG. 9, the inside wall of each of the tooling holes 18 is plated with a thin, conductive layer 23 of, e.g., copper, having a predetermined thickness. When the conductive metal tooling pins 33 of the top mold 30a are inserted into the tooling holes 18 of the PCB 10 during the molding process, the tooling pins 33 make reliable contact with the conductive layers 23 of the tooling holes 18 and ground the PCB 10 to at least the top mold 30a.

The conductive layers 23 in the tooling holes 18 are preferably formed by one of two well-known processes: electroless plating and electrolytic plating. In either case, it is necessary to control the thickness of the layers 23 such that they are not, on the one hand, so thick as to prevent a smooth insertion of the tooling pins 33 into the tooling holes 18, and on the other, so thin that the tooling pins 33 fail to reliably and positively contact them, and hence, ground the PCB to the mold. Thus, it is important to control the thickness of the layers 23 such that the tooling pins 33 insert smoothly into the tooling holes 18 and make a reliable electrical contact with the conductive layers 23. In the embodiment of FIGS. 8 and 9, the inside walls of the tooling holes 18 are plated with layers 23 of copper. However, the conductive metal of the layers 23 is not limited to copper, but may also be selected from other conductive metals, such as tin, gold, or silver, or alloys thereof, without adversely affecting their function.

As skilled practitioners will by now understand, the present invention provides a method of molding BGA semiconductor packages that effectively prevents the accumulation of an electrostatic charge on the components of the package generated by the flow of hot, pressurized molten resin over them during molding of the package. Means are provided for grounding the PCB to at least one of the top and bottom molds so that any such incipient charge is quickly bled off to ground. The molding method thereby effectively prevents any damage to the semiconductor chips, bonding wires or conductive traces of the packages that could result from a rapid discharge of such a charge buildup.

Although the preferred embodiments of the present invention have been described and illustrated for purposes of its explication, those skilled in the art will appreciate that various modifications, additions and substitutions to these embodiments are possible without departing from the scope and spirit of the invention, as defined by the accompanying claims.

What is claimed is:

1. A method of molding a ball grid array (BGA) semiconductor package, the method comprising:
  preparing a printed circuit board (PCB) having a semiconductor chip mounted thereon, said PCB comprising:
    a non-conductive substrate having top and bottom surfaces;
    a plurality of conductive traces in a circuit pattern on each of the top and bottom surfaces of the substrate, the traces including at least one ground trace;
    a plurality of conductive via holes in the substrate, the via holes electrically connecting selected ones of the circuit patterns on the top and bottom surfaces of the substrate to each other;
    a non-conductive solder mask coating over the circuit patterns on the top and bottom surfaces of the substrate to electrically isolate the conductive traces from each other and protect them from the environment; and,
    grounding means on the substrate for electrically connecting the PCB to ground, said grounding means being electrically connected on the PCB to the ground trace and comprising a mold runner gate of a conductive metal on a top surface of the PCB;
  providing grounded, mating first and second molds, the first mold having a depression in it for receiving and seating the PCB therein, the second mold defining a cavity over the PCB and the semiconductor chip thereon and having a runner for introducing and guiding a molten molding resin into the cavity and two projections positioned on opposite sides of the runner for contacting the mold runner gate on the PCB;
  disposing the PCB between the first and second molds such that the projections on the second mold make positive electrical contact with the conductive mold runner gate on the PCB;
  injecting melted molding resin through the runner into the cavity;
  hardening the mold resin injected into the cavity; and,
  removing the BGA package from between the molds.

2. A method of molding a ball grid array (BGA) semiconductor package, the method comprising:
  preparing a printed circuit board (PCB) having a semiconductor chip mounted thereon, said PCB comprising:
    a non-conductive substrate having top and bottom surfaces;
    a plurality of conductive traces in a circuit pattern on each of the top and bottom surfaces of the substrate, the traces including at least one ground trace;
    a plurality of conductive via holes in the substrate, the via holes electrically connecting selected ones of the circuit patterns on the top and bottom surfaces of the substrate to each other;
    a non-conductive solder mask coating over the circuit patterns on the top and bottom surfaces of the substrate to electrically isolate the conductive traces from each other and protect them from the environment; and,
    grounding means on the substrate for electrically connecting the PCB to ground, said grounding means being electrically connected on the PCB to the ground trace and having a height equal to or greater than the thickness of the solder mask;
  providing grounded, mating first and second molds, the first mold having a depression in it for receiving and seating the PCB therein, the second mold defining a cavity over the PCB and the semiconductor chip thereon and having a runner for introducing and guiding a molten molding resin into the cavity;
  disposing the PCB between the first and second molds such that the grounding means on the PCB makes a positive electrical contact with at least one of the molds;
  injecting melted molding resin through the runner into the cavity;
  hardening the mold resin injected into the cavity; and,
  removing the BGA package from between the molds.

3. The method of claim 2, wherein the conductive via holes include at least one ground via hole, said ground via hole being electrically connected on the PCB to both the ground trace and the grounding means.

4. The method of claim 2, further comprising forming a plurality of reference holes in the PCB at positions around the circuit patterns, the reference holes defining a cutting line for separating the BGA package from the substrate, and wherein the grounding means is positioned on the PCB at a position outside of the cutting line such that the grounding means are separated from the package when the package is separated from the substrate.

5. The method of claim 2, wherein the solder mask includes an opening through it on a surface of the PCB opposite to the surface on which the semiconductor chip is mounted, and wherein the grounding means comprises a grounding pad on the PCB located within the opening.

6. The method of claim 2, wherein the solder mask has an opening through it at an edge of the PCB, and wherein the grounding means is located within the opening.

7. The method of claim 2, further comprising:
forming a grounded mold runner gate of a conductive metal on a corner of a top surface of the PCB; and,
electrically connecting the grounding means to the mold runner gate through at least one of the ground via hole and the ground trace.

8. The method of claim 2, wherein the solder mask has an opening through it on a surface of the PCB opposite to the semiconductor chip mounting surface, and wherein the grounding means comprises a grounding boss on the PCB located within the opening.

9. The method claim 2, further comprising plating a conductive metal layer on the grounding means.

10. A method of molding a ball grid array (BGA) semiconductor package, the method comprising:
preparing a printed circuit board (PCB) having a semiconductor chip mounted thereon, said PCB comprising:
a non-conductive substrate having top and bottom surfaces;
a plurality of conductive traces in a circuit pattern on each of the top and bottom surfaces of the substrate, the traces including at least one ground trace;
a plurality of conductive via holes in the substrate, the via holes electrically connecting selected ones of the circuit patterns on the top and bottom surfaces of the substrate to each other;
a non-conductive solder mask coating over the circuit patterns on the top and bottom surfaces of the substrate to electrically isolate the conductive traces from each other and protect them from the environment; and,
grounding means on the substrate for electrically connecting the PCB to ground, said grounding means comprising a plurality of tooling holes located at an edge of the PCB at positions around the circuit patterns, said tooling holes being plated internally with a thin, conductive layer of metal, and at least one of said tooling holes being electrically connected to the ground trace, each of said tooling holes being adapted to receive and make electrical contact with an associated conductive tooling pin;
providing grounded, mating first and second molds, the first mold having a depression in it for receiving and seating the PCB therein, the second mold defining a cavity over the PCB and the semiconductor chip thereon and having a runner for introducing and guiding a molten molding resin into the cavity, and at least one of the molds having at least one electrically conductive tooling pin adapted to extend through an associated tooling hole in the PCB;
disposing the PCB between the first and second molds such that the tooling pins in the molds extend through the tooling holes in the PCB and make positive electrical contact with associated ones thereof;
injecting melted molding resin through the runner into the cavity;
hardening the mold resin injected into the cavity; and,
removing the BGA package from between the molds.

11. A method of molding a ball grid array (BGA) semiconductor package, the method comprising:
preparing a printed circuit board (PCB) having a semiconductor chip mounted thereon, said PCB comprising:
a non-conductive substrate having top and bottom surfaces;
a plurality of conductive traces in a circuit pattern on each of the top and bottom surfaces of the substrate, the traces including at least one ground trace comprising a first, V-shaped trace diverging from a junction point on the PCB, and a second, middle trace that is narrower and/or thinner than the V-shaped trace, the second trace having a first end electrically connected to a ground via hole;
a plurality of conductive via holes in the substrate, the via holes electrically connecting selected ones of the circuit patterns on the top and bottom surfaces of the substrate to each other;
a non-conductive solder mask coating over the circuit patterns on the top and bottom surfaces of the substrate to electrically isolate the conductive traces from each other and protect them from the environment; and,
grounding means on the substrate for electrically connecting the PCB to ground, said grounding means being electrically connected on the PCB to the ground trace and comprising an opening in the solder mask at the junction of the V-shaped ground trace and a raised grounding boss plated on the junction;
providing grounded, mating first and second molds, the first mold having a depression in it for receiving and seating the PCB therein, the second mold defining a cavity over the PCB and the semiconductor chip thereon and having a runner for introducing and guiding a molten molding resin into the cavity;
disposing the PCB between the first and second molds such that the grounding boss on the PCB makes a positive electrical contact with at least one of the molds;
injecting melted molding resin through the runner into the cavity;
hardening the mold resin injected into the cavity; and,
removing the BGA package from between the molds.

12. The method of claim 2, further comprising plating a conductive metal layer on the grounding means.

13. The method of claim 10, further comprising plating a conductive metal layer on the grounding means.

14. The method of claim 11, further comprising plating a conductive metal layer on the grounding means.

* * * * *